US011158548B2

(12) United States Patent
Lamhot et al.

(10) Patent No.: US 11,158,548 B2
(45) Date of Patent: Oct. 26, 2021

(54) OVERLAY MEASUREMENT USING MULTIPLE WAVELENGTHS

(71) Applicant: KLA-TENCOR CORPORATION, Milpitas, CA (US)

(72) Inventors: Yuval Lamhot, Haifa (IL); Eran Amit, Haifa (IL); Einat Peled, Haifa (IL); Noga Sella, Migdal HaEmek (IL); Wei-Te Cheng, Taichung (TW); Ido Adam, Qiriat Ono (IL)

(73) Assignee: KLA-Tencor Corporation, Milpitas, CA (US)

( * ) Notice: Subject to any disclaimer, the term of this patent is extended or adjusted under 35 U.S.C. 154(b) by 314 days.

(21) Appl. No.: 16/092,559

(22) PCT Filed: Sep. 3, 2018

(86) PCT No.: PCT/US2018/049295
§ 371 (c)(1),
(2) Date: Oct. 10, 2018

(87) PCT Pub. No.: WO2019/182637
PCT Pub. Date: Sep. 26, 2019

(65) Prior Publication Data
US 2020/0381312 A1    Dec. 3, 2020

Related U.S. Application Data

(60) Provisional application No. 62/645,090, filed on Mar. 19, 2018.

(51) Int. Cl.
*H01L 21/00* (2006.01)
*H01L 21/66* (2006.01)
(Continued)

(52) U.S. Cl.
CPC ............. *H01L 22/12* (2013.01); *G01N 21/31* (2013.01); *H01L 21/67259* (2013.01);
(Continued)

(58) Field of Classification Search
CPC . H01L 22/12; H01L 21/67259; G01B 11/272; G03F 7/70516; G03F 7/70633;
(Continued)

(56) References Cited

U.S. PATENT DOCUMENTS

2002/0158193 A1\* 10/2002 Sezginer ............. G03F 7/70633
250/237 G
2009/0296075 A1   12/2009 Hu et al.
(Continued)

OTHER PUBLICATIONS

Adel et al., Diffraction order control in overlay metrology—A review of the roadmap options, Proceedings of SPIE—The International Society for Optical Engineering, vol. 6922, Apr. 2008.
(Continued)

*Primary Examiner* — Brook Kebede
(74) *Attorney, Agent, or Firm* — Hodgson Russ LLP

(57) ABSTRACT

A method of determining overlay ("OVL") in a pattern in a semiconductor wafer manufacturing process comprises capturing images from a cell in a metrology target formed in at least two different layers in the wafer with parts of the target offset in opposing directions with respect to corresponding parts in a different layer. The images may be captured using radiation of multiple different wavelengths, each image including +1 and -1 diffraction patterns. A first and second differential signal may be determined for respective pixels in each image by subtracting opposing pixels from the +1 and -1 diffraction orders for each of the multiple wavelengths. An OVL for the respective pixels may be determined based on analyzing the differential signals from multiple wavelengths simultaneously. Then an OVL for the pattern may be
(Continued)

determined as a weighted average of the OVL of the respective pixels.

11 Claims, 8 Drawing Sheets

(51) Int. Cl.
*G01N 21/31* (2006.01)
*H01L 21/67* (2006.01)

(52) U.S. Cl.
CPC ............... *G01N 2201/064* (2013.01); *G01N 2201/0631* (2013.01); *G01N 2201/0633* (2013.01); *G01N 2201/0636* (2013.01); *G01N 2201/08* (2013.01)

(58) Field of Classification Search
CPC ............ G03F 7/70683; G01N 21/31; G01N 21/8806; G01N 21/9501; G01N 2201/0631

USPC .......................................................... 438/14
See application file for complete search history.

(56) References Cited

U.S. PATENT DOCUMENTS

| | | |
|---|---|---|
| 2015/0233705 A1 | 8/2015 | Bringoltz et al. |
| 2015/0316490 A1 | 11/2015 | Amit et al. |
| 2016/0146740 A1* | 5/2016 | Lu ..................... G03F 7/70633 |
| | | 356/620 |
| 2016/0253450 A1 | 9/2016 | Kandel et al. |
| 2016/0313658 A1 | 10/2016 | Marciano et al. |
| 2017/0052454 A1 | 2/2017 | Jak et al. |
| 2017/0336198 A1 | 11/2017 | Adel et al. |

OTHER PUBLICATIONS

ISA/KR, International Search Report for PCT/US2018/049295 dated Dec. 24, 2018.

* cited by examiner

OVERLAY MEASUREMENT USING MULTIPLE WAVELENGTHS

CROSS REFERENCE TO RELATED APPLICATIONS

This application claims the benefit of U.S. Provisional Patent Application No. 62/645,090 filed Mar. 19, 2018, which is incorporated herein by reference in its entirety.

BACKGROUND OF THE INVENTION

1. Technical Field

The present invention relates to the measurement of overlay (OVL) in semiconductor wafer manufacturing processes.

2. Discussion of Related Art

Semiconductor components, such as integrated circuits, may be manufactured in the form of a wafer containing many components. Semiconductor wafers, e.g. silicon wafers, may be manufactured in a series of layers each consisting of a pattern that must be accurately positioned with respect to patterns in the adjacent layers. The control of this positioning is called OVL control. In some semiconductor and lithography manufacturing processes, a metrology target is provided on the wafer for use in ensuring pattern alignment. The target may take the form of a set of cells, for example a 2×2 array of rectangular or square cells, two for measuring OVL in the X direction and two for measuring OVL in the Y direction. The target may include a diffraction grating. For example, each cell in a target may consist of a diffraction grating. A target may consist of a set of patterns, where each pattern may be printed on a different layer and may be oriented such as to provide measurement in different directions, typically X and Y. The measurement of radiation diffracted by a target is known as scatterometry.

Some previous metrology algorithms use monochromatic data to calculate OVL, and some methods average signals over all pixels in images of a diffraction grating to calculate OVL.

SUMMARY OF THE INVENTION

The following is a simplified summary providing an initial understanding of the invention. The summary does not necessarily identify key elements nor limits the scope of the invention, but merely serves as an introduction to the following description.

Some embodiments of the invention provide methods and systems for determining OVL in a semiconductor wafer manufacturing process. Such methods and processes may use images captured from a metrology target formed in at least two different layers in the wafer with parts of the target offset in opposing directions with respect to corresponding parts in a different layer. For example, layers in one cell of the target may be offset in one direction and layers in another cell may be offset equally in the opposite direction. The images may be formed using radiation of multiple different wavelengths, each image including +1 and −1 diffraction patterns. First and second differential signals may be determined for respective parts of the target, for example respective cells, by subtracting opposing pixels from the +1 and −1 diffraction orders in each image for each of the multiple wavelengths. A measurement of OVL may be determined for the respective pixels based on the differential signals from the multiple wavelengths. An overall measurement of OVL may then be determined as a weighted average of the OVL of the respective pixels, wherein the weighting is according to the variation of the sensitivity of the OVL due to variations in wavelength.

OVL measurement according to some embodiments of the invention may be termed "self-accurate", or "self-referencing" in that an OVL "ruler" is produced thus enabling the tool to find the most accurate in-line measurement setup. Self-accuracy metrology according to some embodiments of the invention allows measurement of accurate OVL values per location on the wafer, giving a set of OVL values. The self-accuracy uses multiple wavelength measurements simultaneously to root out inaccuracy forming terms in the signals and find the correct OVL value. The final set of OVL values can also be used as reference for other types of OVL measurement or for deep learning algorithms.

Self-accuracy metrology according to some embodiments of the invention may measure a certain target using several neighboring wavelengths and analyze the signals from all these measurements together. The measurement data may be fitted separately for each pixel and the OVL per pixel may be found after removing the inaccuracy forming term from the optical signals.

An aspect of some embodiments of the invention is the use of wavelength tenability to find the inaccuracy forming term in the optical measurement and calculating the true, or absolute, OVL.

Embodiments of the invention are not limited to semiconductor wafer production and may be used in the manufacture of many other products.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings.

DETAILED DESCRIPTION OF THE INVENTION

Figure 1A:
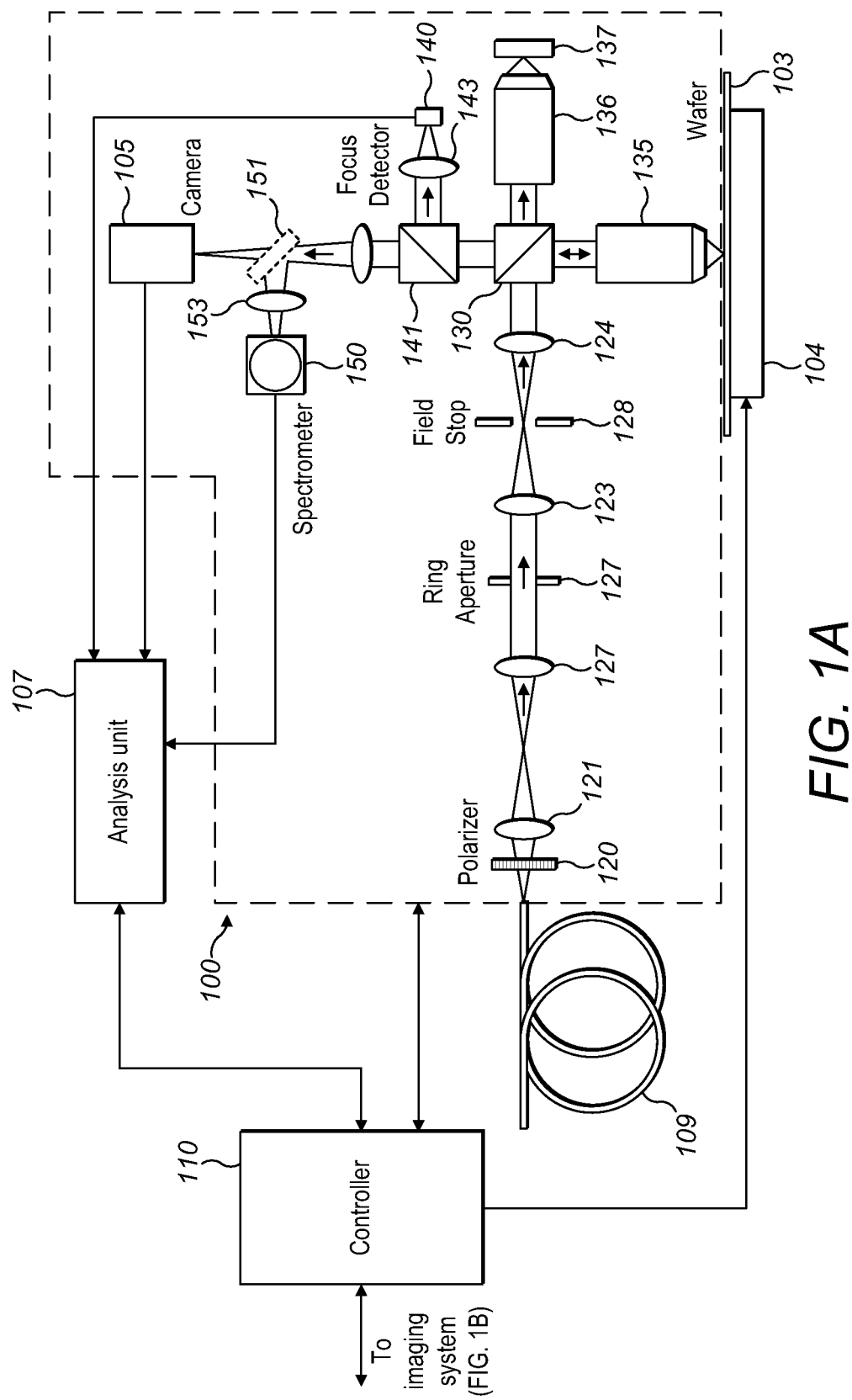
FIGS. 1A and 1B are schematic diagrams of a system according to some embodiments of the invention for use performing metrology measurements on semiconductor wafers.

Prior to the detailed description being set forth, it may be helpful to set forth definitions of certain terms that will be used hereinafter.

In the following description, various aspects of the present invention are described. For purposes of explanation, specific configurations and details are set forth in order to provide a thorough understanding of the present invention. However, it will also be apparent to one skilled in the art that the present invention may be practiced without the specific details presented herein. Furthermore, well known features may have been omitted or simplified in order not to obscure the present invention. With specific reference to the drawings, it is stressed that the particulars shown are by way of example and for purposes of illustrative discussion of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments that may be practiced or carried out in various ways as well as to combinations of the disclosed embodiments. Also, it is to be understood that the phraseology and terminology employed herein is for the purpose of description and should not be regarded as limiting.

Unless otherwise stated, features described in relation to one or more embodiments of the invention may optionally be included in all other embodiments of the invention.

Unless specifically stated otherwise, as apparent from the following discussions, it is appreciated that throughout the specification discussions utilizing terms such as "processing", "computing", "calculating", "determining", "enhancing" or the like, refer to the action and/or processes of a computer or computing system, or similar electronic computing device, that manipulates and/or transforms data represented as physical, such as electronic, quantities within the computing system's registers and/or memories into other data similarly represented as physical quantities within the computing system's memories, registers or other such information storage, transmission or display devices.

A method according to some embodiments of the invention may comprise capturing an image of a cell in a metrology target using multiple different wavelengths. Then, an OVL in a pattern formed e.g. in a semiconductor wafer may be determined as a as a weighted average of the OVL of the respective pixels. The weighting may be according to the variation of the sensitivity of the OVL due to variations in wavelength. The method may be carried out in a system in which the illumination wavelength may be varied. One such system will now be described with reference to FIGS. 1A and 1B.

Figure 1B:
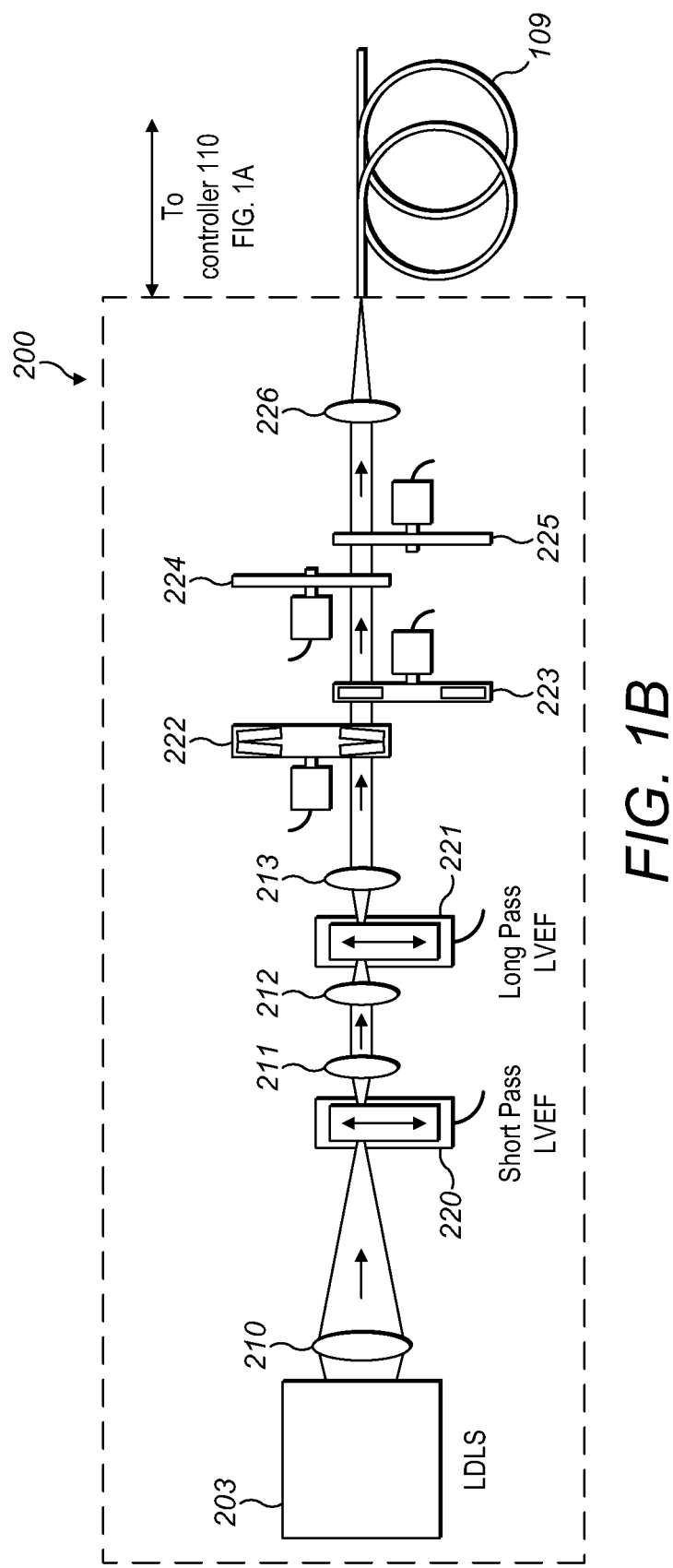

FIGS. 1A and 1B are schematic diagrams of a system according to some embodiments of the invention for use performing metrology measurements on semiconductor wafers. Systems and methods as described herein may be used in the manufacture or measurement of other products formed by a layered manufacturing process.

FIG. 1A shows an imaging system 100 arranged to direct radiation towards the surface of a wafer and to receive radiation reflected from a wafer to produce images of the wafer, and FIG. 1B shows an illumination system 200 which may be used to supply radiation to the imaging system of FIG. 1A.

In the imaging system 100 of FIG. 1A, radiation, such as visible light, is directed towards the surface of a product, in this illustration wafer 103, on a support 104. The radiation may be directed at a metrology target. Reflected radiation is received from the surface of the wafer 103 and used to produce images of the wafer, for example in a camera 105. The images may be analyzed in an analysis unit 107. The operation of the imaging system may be controlled by a controller 110.

The radiation may be supplied to the imaging system 100 by an optical fiber 109 and pass through polarizer 120 and lenses 121-124, to reach beam splitter 130. A ring aperture 127 may be positioned between lenses 122 and 123 and a field stop 128 may be positioned between lenses 123 and 124, whose functions will be understood by those skilled in the art. A beam splitter 130 may split the radiation such that one part of the radiation is directed via an objective lens system 135 to the wafer 103 and one different part of the radiation is directed via an objective lens system 136 to a mirror 137. The same pair of objective lens systems 135 and 136 may collect scattered radiation from the wafer 103 and reflected radiation from the mirror 137 and the same beam splitter 130 may combine the radiation from the wafer and the mirror to form a single radiation field whose details are sensitive to the distance between the objective 135 and the wafer 103 (the focus), in a way that allows the defocus to be deduced.

Some of the combined radiation may be directed to a focus detector 140, whose function is described further herein. For example, some of the combined radiation may be directed to the focus detector 140 by a beam splitter 141 and lens 143. Some of the reflected radiation may be directed to a spectrometer 150. For example, some of the reflected radiation may be directed to the spectrometer 150 by a beam splitter 151 and lens 153. The focus detector 140 may perform focus measurements and output signals indicative of those measurements to the analysis unit 107. Similarly, the spectrometer 150 may perform spectral measurements and output signals indicative of those measurements to the analysis unit 107.

Camera 105 may be a charge coupled device or "CCD" array. Camera 105 may be arranged, or set, to form an image from the reflected radiation at the "image" plane, as is known in the art. For example, the wafer 103 may include a diffraction pattern on its surface in which case the reflected radiation may be diffracted radiation from the surface of the wafer 103. According to some embodiments of this invention, the image plane at which an image is captured from a cell in the form of a diffraction pattern, is the pupil plane.

Various ones of the components forming part of the imaging system 100 of FIG. 1A, or the wafer support 104, may be moved with respect to each other, for example by one or more motors not shown and known to those skilled in the art. The operation of the imaging system 100, for example the operation of motors forming part of the imaging system 100, may be controlled by controller 110. The operation of controller 110 may be based in part on signals from analysis unit 107. Analysis unit 107 or controller 110 or both may comprise a computing system including on or more processors. For example, a processor in analysis unit 107 operating under the control of an algorithm, may perform a method according to some embodiments of the invention. Therefore some embodiments of the invention may comprise a computer readable medium, in transitory or non-transitory form, comprising instructions for implementation in a processor in an analysis unit.

Controller 110 may control imaging system 100 to vary one or more imaging parameters between successive image capturing operations, for example to form a series of images to be analyzed by analysis unit 107. Thus for example the controller 110 may control the polarizer 120 to change the polarization of the radiation between one image and another. The controller may control the position of any of the lenses, or the wafer support 104, for example lenses in objective lens system 135 with respect to each other or to wafer support 104, to vary the focus and thereby obtain a series of images each with a different degree of focus. The controller may control the operation of the ring aperture 127 to vary the numerical aperture between one image and another.

Referring now to FIG. 1B, the illumination system 200 according to some embodiments of the invention comprises a source of radiation 203. This may be any suitable radiation source known to those skilled in the art. According to some embodiments of the invention, the source of radiation 203 may comprise multiple radiation sources of different wavelengths and/or bandwidths, from which one or more may be selected, for example in order to vary the wavelength and/or bandwidth used to illuminate a product, or target.

As shown in FIG. 1B, radiation from source 203 passes through a series of lenses 210-214 and filters 220-226 to optical fiber 109. The illumination system 200 may be operable to vary one or more imaging parameters, e.g. parameters which when varied cause a variation in an image captured by an image capturing device, e.g. using the radiation source 203 as a source of illumination. An example of an imaging parameter that may be varied by controlling the illumination system is the wavelength of the radiation. A wafer manufacturing control system may include a variable wavelength illumination system in which case some embodiments of the invention may be implemented by operating an existing system, e.g. existing hardware, in a novel way. According to some embodiments of the invention new hardware or software, including components operable to vary the wavelength of radiation used to illuminate a wafer to be imaged, may be provided.

In the system illustrated in FIG. 1B, filters 222-226 may comprise filters in an existing wafer manufacturing control system such as bandpass and gradient filters whose functions will be known to those skilled in the art. Filters 220 and 221 may be used to vary the wavelength of radiation delivered to imaging system 100 according to some embodiments of the invention, for example where this cannot be achieved by filters 222-226.

In practice an illumination system may use radiation polarized in different ways in which case differently polarized radiation may be conducted along different channels from the source 203 to the optical fiber 109. Only one channel is illustrated in FIG. 1B for simplicity but it will be appreciated that in a practical system a number of channels may be provided according to the number of polarizations.

According to some embodiments of the invention, the wavelength of radiation used to illuminate the product, e.g. wafer 103, may be varied in any known manner of wavelength variation. A system according to some embodiments of the invention may include mechanical apparatus to filter a narrow band of wavelengths of light from a wider band source. For example, a wide band radiation source may be mechanically distributed by means of a prism from which light in a particular wavelength band, or color, may be mechanically selected, for example using a shutter mechanism. In the example shown in FIG. 1B, filters 211 and 212 may be high pass and low pass filters respectively. Additionally or alternatively, filters 211 and 212 may be tunable as known in the art to vary the wavelength of radiation.

It will be appreciated to one skilled in optics that the order of some of the components shown in FIGS. 1A and 1B, such as lenses and beam splitters, may be varied whilst still enabling the system to operate as described herein. In particular, some of the components of the imaging system 100 as illustrated may form part of the illumination system 200 and some of the components of the illumination system 200 may form part of the imaging system 100.

Figure 2B:
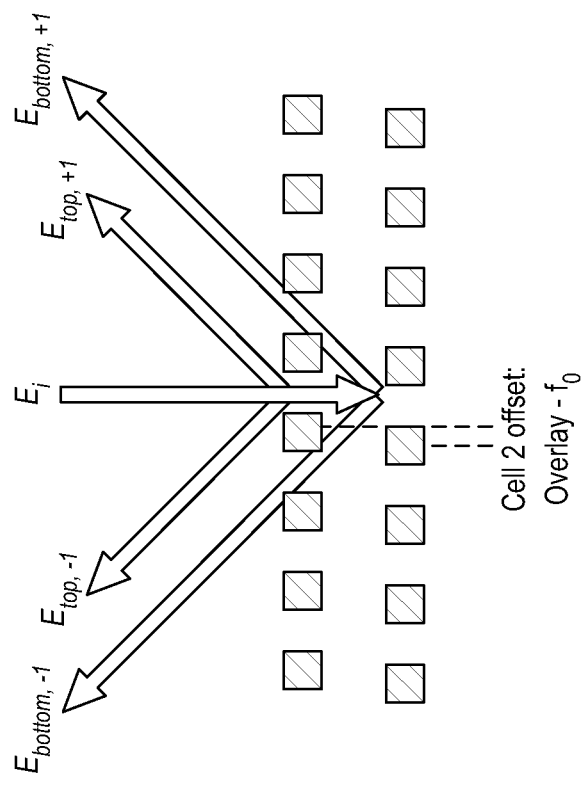
FIGS. 2A and 2B are a cross sectional diagrams of two cells of a scatterometry OVL (SCOL) target, according to some embodiments of the invention.
Figure 2A:
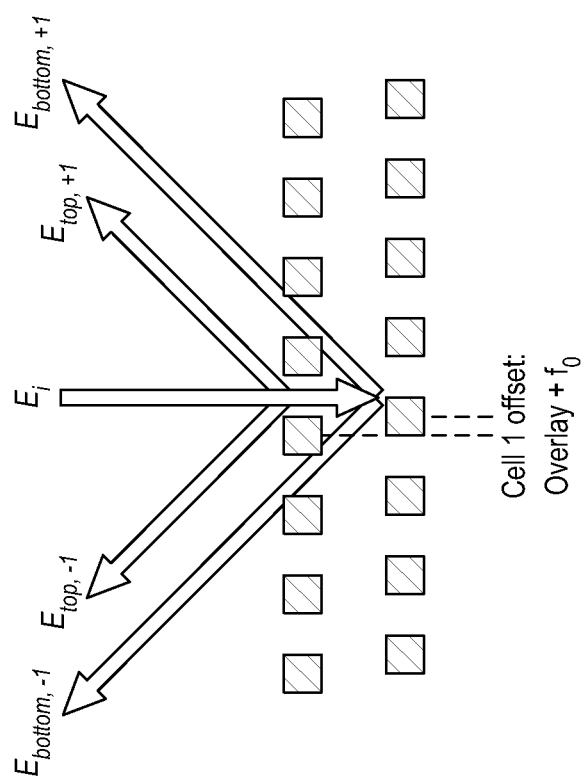

A method according to some embodiments of the invention will now be described with reference to FIGS. 2-4. The method may commence with operation 401 of FIG. 4, receiving images captured from a cell in a metrology target which has been formed in at least two different layers in the wafer, with parts of the target offset in opposing directions with respect to corresponding parts in a different layer. For example, layers in different cells of the target may be offset in different directions. The method may include the capturing itself. Alternatively a method according to some embodiments of the invention may analyse previously captured images. The capturing may be, for example, by camera 105. An example of a suitable target is illustrated schematically in FIGS. 2A and 2B. FIGS. 2A and 2B show in cross section two cells a SCOL metrology target, including an upper and lower periodic grating (black rectangles), formed in respective layers in a wafer. The lower grating is offset with respect to the upper grating in the horizontal direction. The offset in the cell shown in FIG. 2A is equal and opposite to the offset in the cell shown on the right. FIGS. 2A and 2B further show incoming light $E_i$, and diffracted light: plus and minus first order from the upper layer grating ($E_{top,1}$, $E_{top,-1}$), and plus and minus first order from the lower layer grating 2 ($E_{bottom,1}$, $E_{bottom,-1}$) are shown.

Figure 3A:
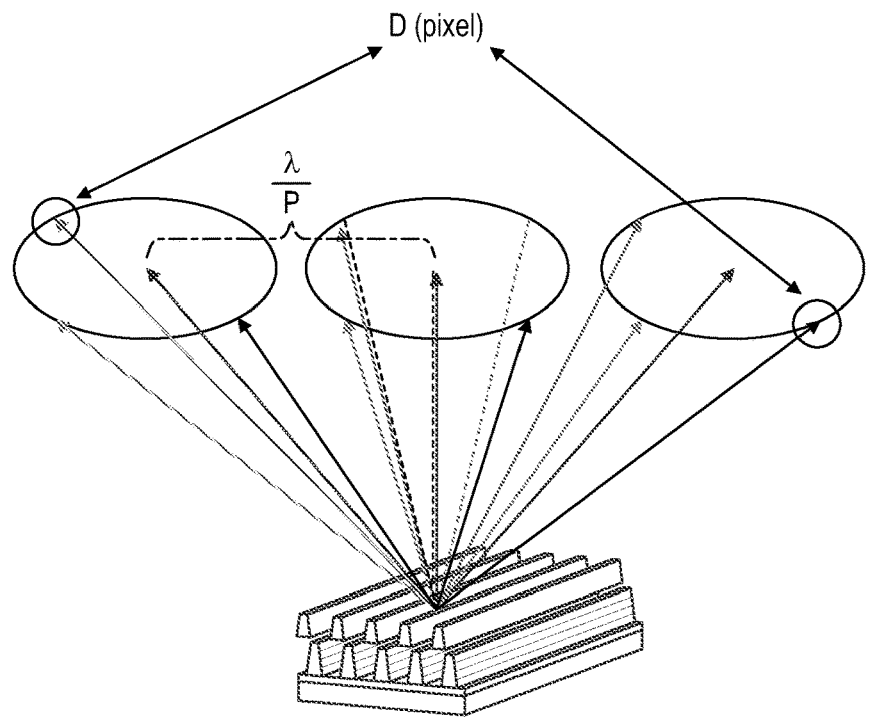
FIG. 3A is a schematic diagram showing the formation of diffraction patterns from different layers of a cell in a target and FIG. 3B shows an example of a captured image according to some embodiments of the invention including positive and negative first order diffraction patterns.
Figure 4:
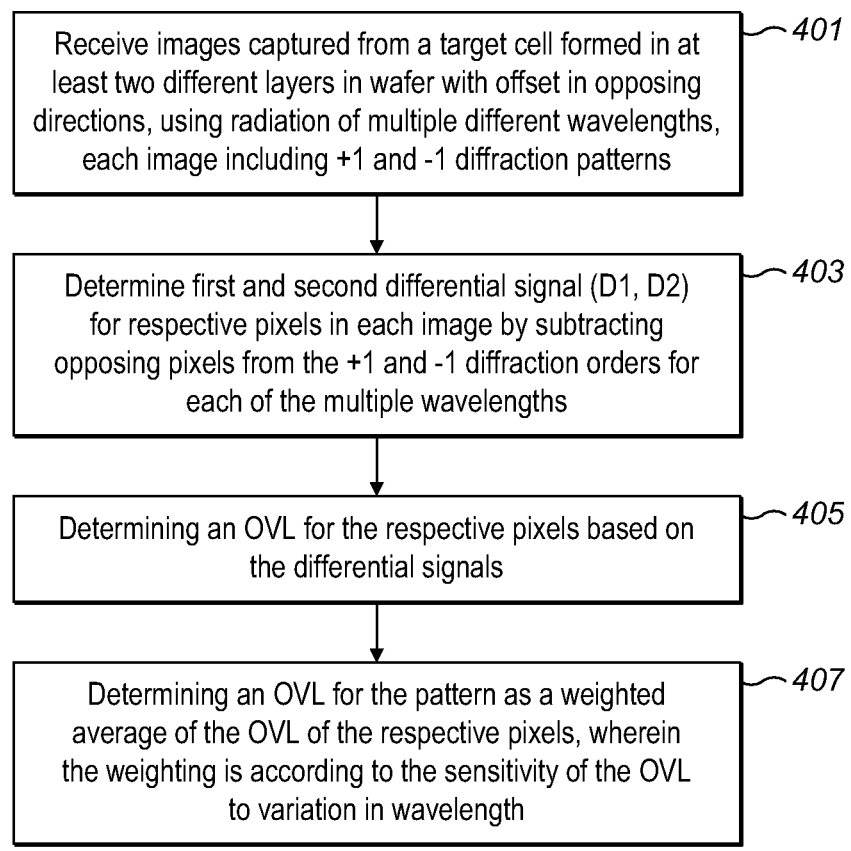
FIG. 4 is a flowchart of a method according to some embodiments of the invention.

FIG. 3A is a perspective view similar to FIG. 2B showing the formation of the zero and first order diffraction patterns.

Figure 3B:
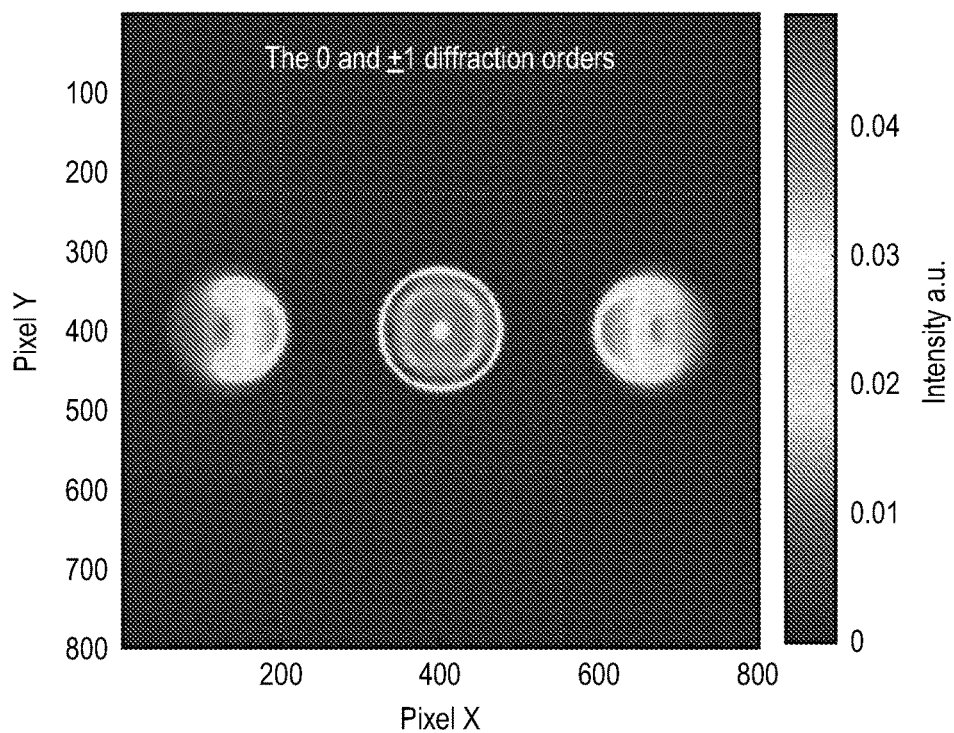

An example of a captured image is shown in FIG. 3B and includes positive and negative first order (+1 and −1) diffraction patterns as well as the zero-order diffraction pattern, as will be familiar to those skilled in the art. An image such as that shown in FIG. 3B may be captured at multiple different wavelengths, for example neighboring wavelengths in a narrow band. According to some embodiments of the invention, operation 401 may be preceded by one or more operations to determine the different wavelengths or waveband, described further herein.

A metrology method according to some embodiments of the present invention measures optical signals using the diffracted intensity from a cell in a target with an additional deliberate offset of either $\pm f_0$ (as was used in the SCOL algorithm described in "Diffraction order control in overlay metrology—a review of the roadmap options" Proc. SPIE 6922, Metrology, Inspection, and Process Control for Microlithography XXII, 692202 (14 Mar. 2008); doi: 10.1117/12.773243, by Adel et al.). The determination of OVL in one dimension using is discussed in the following and with reference to FIG. 4. Operations 403-407 of FIG. 4 and other mathematical operations described herein may be performed by analysis unit 107 for example.

A per pixel differential signal may be determined for each cell, $D_1$ for the plus offset, $D_2$ for the minus, where D may represent intensity or gray level for example. The differential signals may be determined, or calculated, by subtracting opposing pixels from the ±1 diffraction orders at operation 403 and indicated schematically in FIG. 3A. The differential signals may be determined for each of the multiple wavelengths. Then, at operation 405 an OVL for the respective pixels may be determined based on the differential signals $D_1$, $D_2$. At operation 407 an OVL for the pattern, or "overall" OVL may be determined from the OVLs of the respective pixels. According to some embodiments of the present invention, this overall OVL may be determined as a weighted average of the OVL of the respective pixels, wherein the weighting is according to the variation of the sensitivity of the OVL due to variations in wavelength.

The OVL of an individual pixel may be determined in various ways. According to some embodiments of the invention, the per pixel OVL is determined by a formula that includes first and second matrices. The first matrix may comprise values of sensitivity of the differential signals to OVL at different wavelengths. The second matrix may comprise values of average differential signals at different wavelengths. This is now described mathematically:

Using data from several wavelengths, for example from images captured at several different wavelengths, the following optical signal matrices ($N_{pixels} \times N_{wavelengths}$) can be defined:

$$G_{sig}(\lambda,\text{pix}) = \frac{1}{2}(D_1(\lambda,\text{pix}) - D_2(\lambda,\text{pix})) \text{ and } K_{sig}(\lambda,\text{pix}) = \frac{1}{2}(D_1(\lambda,\text{pix}) + D_2(\lambda,\text{pix}))$$ Equation 1:

with the pix index relating to the location of the pixel in the original illumination spot (relating to a specific angle of illumination). $K_{sig}$ is the average of the differential signals and represents asymmetry in the OVL, and $G_{sig}$ is derived from the difference between the differential signals, both determined for different pixels and different wavelengths. The $G_{sig}$ is also referred to as sensitivity since it describes how sensitive the $K_{sig}$ is to the presence of OVL (see Equation 4).

The sensitivity in each pixel of the pupil might be different. A resonance is formed when the sensitivity is approximately equal to zero. Looking at data from a specific wavelength range, the per pixel sensitivity can change sign over the entire pupil. This means that each pixel went through a resonance in that wavelength range, and the exact wavelength the resonance passed the pixel might differ from pixel to pixel. The resonance wavelength value $WL_{res}$ can be mapped as a function of pixel $WL_{res}$ (pix). The resonance wavelength may be determined for example by analyzing the images at different wavelengths captured at operation 401.

In the following calculations the use of ⟨ ⟩ brackets means taking an average in the first dimension of the matrices (the wavelength direction), resulting in a vector the size of the number of pixels, $N_{pixel}$. Furthermore, multiplying using · means multiplying each element of the matrix or vector with the same element of the other matrix/vector.

Self-accuracy OVL measurement according to some embodiments of the invention can be done using several modes, two of which are described herein as non-limiting examples.

In the first mode the measurements are around a certain resonance. During the calculations, the optical signal matrices are rearranged to form new signal matrices that are centered around the per pixel wavelength resonance $WL_{res}$ (pix). The following optical matrices are defined:

$$G(\text{ind}_\lambda,\text{pix}) = G_{sig}(WL_{res}(\text{pix}) + \text{ind}_\lambda \times \Delta\lambda) \text{ind}_\lambda \in (-N_{WL}, -N_{WL}+1, \ldots 0, \ldots N_{WL}-1, N_{WL})$$ Equation 2:

$$K(\text{ind}_\lambda,\text{pix}) = K_{sig}(WL_{res}(\text{pix}) + \text{ind}_\lambda \times \Delta\lambda) \text{ind}_\lambda \in (-N_{WL}, -N_{WL}+1, \ldots 0, \ldots N_{WL}-1, N_{WL})$$ Equation 3:

with $N_{WL}$ being a number of data points for each pixel on both sides of that $WL_{res}$(pix), $\Delta\lambda$ is the wavelength resolution used during the measurement. In this mode both G and K have a final size of (Npixels×(2$N_{WL}$+1)). $N_{WL}$ may be defined by a user, for example an operator of a system as shown in FIGS. 1A and 1B, or predefined in an analysis algorithm.

Another mode of self-reference would be to capture images over the whole wavelength or spectral landscape, e.g. all of the wavelengths available in the system, or at least a wider range than a few each side of a resonant wavelength. The wider landscape could be analyzed and a wavelength region or regions could be chosen. These wavelengths could be solely from flat regions, e.g. wavelengths where the signals, for example signal matrices such as $G_{sig}$, have a large sensitivity to wavelength and the overlay measured using standard SCOL varies little with wavelength. Another option is to take these wavelengths from a combination of flats and resonances. In this case the G and K matrices will be the same as the original Gsig and Ksig matrices as defined in equation 1. The data used will be collected using wavelengths belonging to a specific flat region, multiple flat regions or multiple regions.

OVL measurement according to some embodiments of the invention may be based on an assumption that the optical signals have the following linear dependency:

$$K(\text{ind}_\lambda, \text{pix}) = G(\text{ind}_\lambda, \text{pix}) \frac{\text{overlay}}{f_0} + \delta A(\text{pix}).$$ Equation 4

The δA(pix) is termed herein a "per pixel inaccuracy" forming term which under certain circumstances may be wavelength independent. In reality δA might also be wavelength dependent. There are some spectral regions where this term is fairly constant regarding to change in wavelength. For instance, some optical resonances are prone to have a constant inaccuracy term and thus good for self-accuracy calculations. In order to check the wavelength independence assumption, the following inequality needs to be true:

$$\frac{\partial G}{\partial \lambda} \gg \frac{\partial \delta A}{\partial \lambda}.$$ Equation 5

In other words, the rate of change of sensitivity with wavelength should be very much greater that the rate of change of per pixel inaccuracy with wavelength.

The OVL per pixel may be calculated using a formula or equation that includes the first and second matrices defined in equations 2 and 3, for example:

$$OVL_{pp}(\text{pix}) = f_0 \frac{\langle K \cdot G \rangle - \langle K \rangle \cdot \langle G \rangle}{\langle G \cdot G \rangle - \langle G \rangle \cdot \langle G \rangle}.$$ Equation 6

In this equation the per-pixel inaccuracy δA(pix) is cancelled out.

It is noted that the measurement data may be fitted separately for each pixel and the OVL per pixel may be found after removing the inaccuracy forming term from the optical signals. In certain embodiments, the per pixel OVL value may have the inaccuracy forming term subtracted to result in an improved OVL measurement. As the inaccuracy forming term is basically "dA" in Equation 4, Equation 6 may be used to calculate the OVL per pixel in a way that removes the inaccuracy forming term, or dA.

The OVL per pixel may be weighted for use in determining an overall OVL for a pattern. The weight may be according to the sensitivity of the per pixel OVL to variation in wavelength. For example, the weight per pixel may be given by:

$$W_{pp}(\text{pix}) = \langle G \cdot G \rangle - \langle G \rangle \cdot \langle G \rangle \quad \text{Equation 7:}$$

The final, or "overall" OVL may be determined as a weighted average of the OVL per pixel, for example:

$$\text{overlay} = \frac{\sum_{pix} OVL_{pp}(pix) \cdot W_{pp}(pix)}{\sum_{pix} W_{pp}(pix)}. \quad \text{Equation 8}$$

The per pixel inaccuracy forming term is given by:

$$\delta A(pix) = \langle K \rangle - \frac{\text{overlay}}{f_0} \langle G \rangle. \quad \text{Equation 9}$$

This is removed automatically by calculating the OVL per pixel according to equation 6.

It is noted that while the inaccuracy is independent of OVL, both the inaccuracy and the overlay depend on process variation across wafer and time. A pattern on a certain site might differ from one wafer to another in respect to wafer in the same Lot or different Lots. The dA as a function of pixel for a certain site, can be monitored. If it changes abruptly, that would mean there was a major change in the manufacturing process.

In order to check the assumption of Eq. 5, the following per wavelength inaccuracy forming term matrix can be calculated:

$$\delta A_{perWL}(ind_\lambda, pix) = K(ind_\lambda, pix) - G(ind_\lambda, pix)\frac{\text{overlay}}{f_0}. \quad \text{Equation 10}$$

This per wavelength inaccuracy forming term relates to the per pixel inaccuracy forming term calculated in Equation 9 in the following manner:

$$\delta A(\text{pix}) = \langle \delta A_{perWL}(ind_\lambda, pix) \rangle. \quad \text{Equation 11:}$$

This term is also used to check the assumption of Equation 5

$$\frac{\partial G}{\partial \lambda} \gg \frac{\partial}{\partial \lambda}(\delta A_{perWL}).$$

The δA(pix) can also be used to track process variations (PVs) in a wafer or between wafers, as described in US20150316490 A1. A certain target will experience different PVs as a function of the target location in the die or on the wafer. These PVs will in turn change the inaccuracy forming term δA(pix), thus enabling a quantifiable measurement of how much the PV influenced the optical signal. Since δA(pix) does not depend on OVL, a sudden change in this optical pupil measurement, δA(pix) can be used to identify a PV split, or variation in a fabrication process.

According to equation 4, shifting the K data of each pixel by $K_{shift}(ind_\lambda, pix) = K(ind_\lambda, pix) - \delta A(pix)$ should be proportional to G.

Figure 5A:
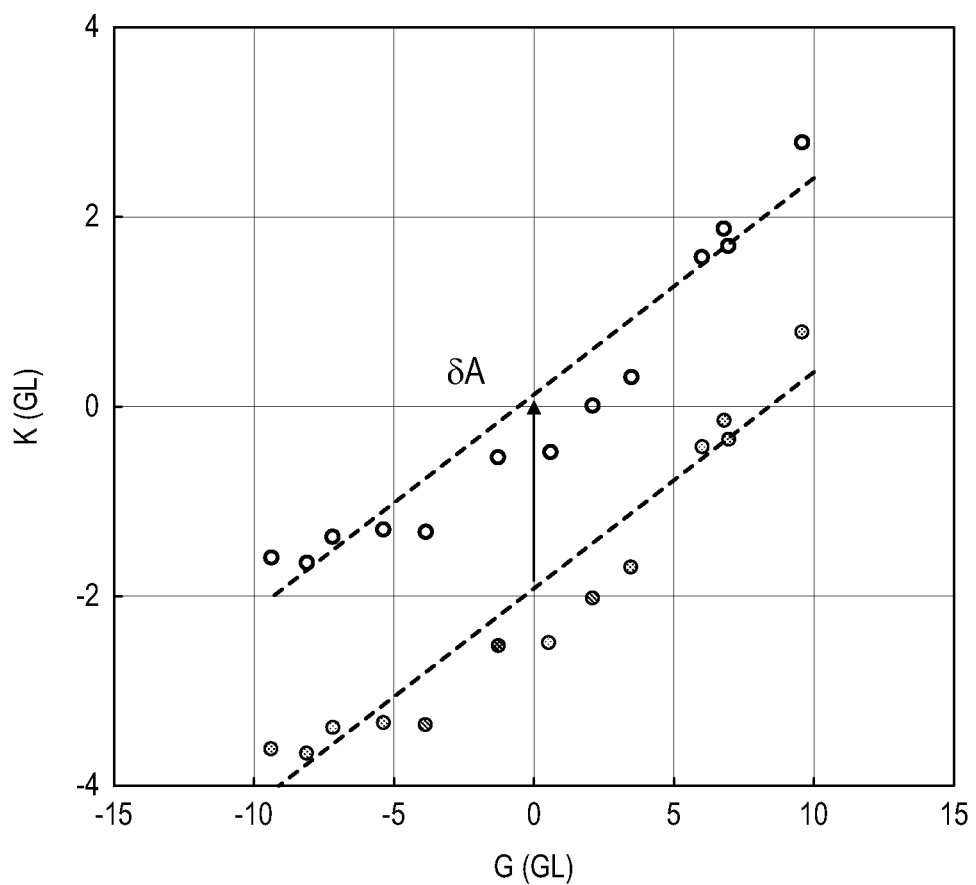
FIGS. 5A and 5B show measurement results demonstrating modelling according to some embodiments of the invention.
Figure 5B:
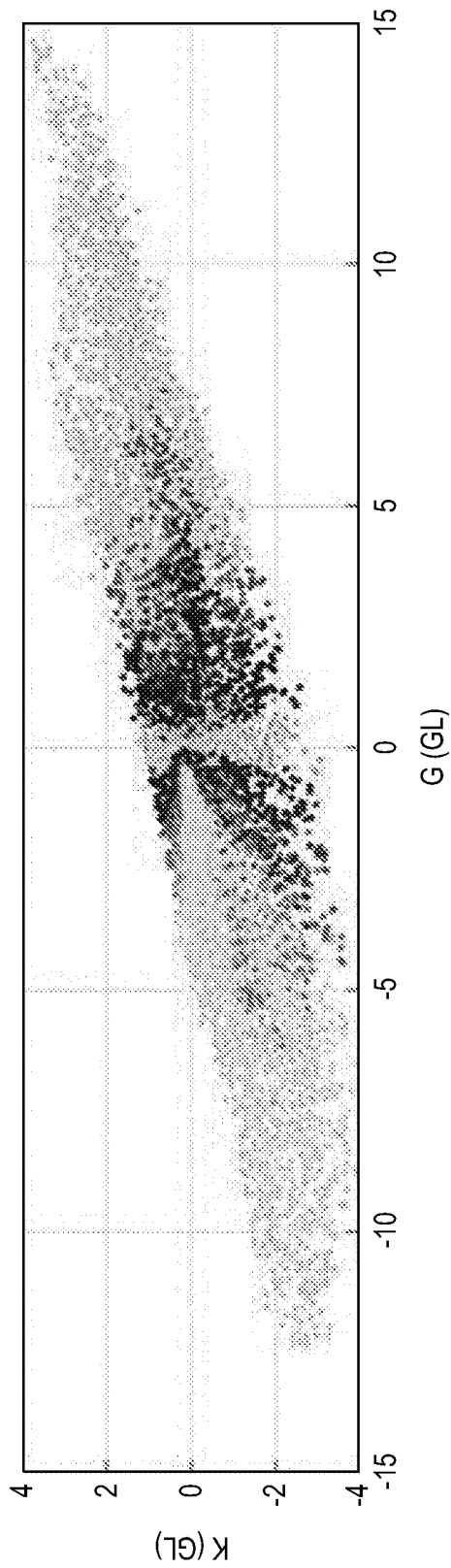
Figure 5B:
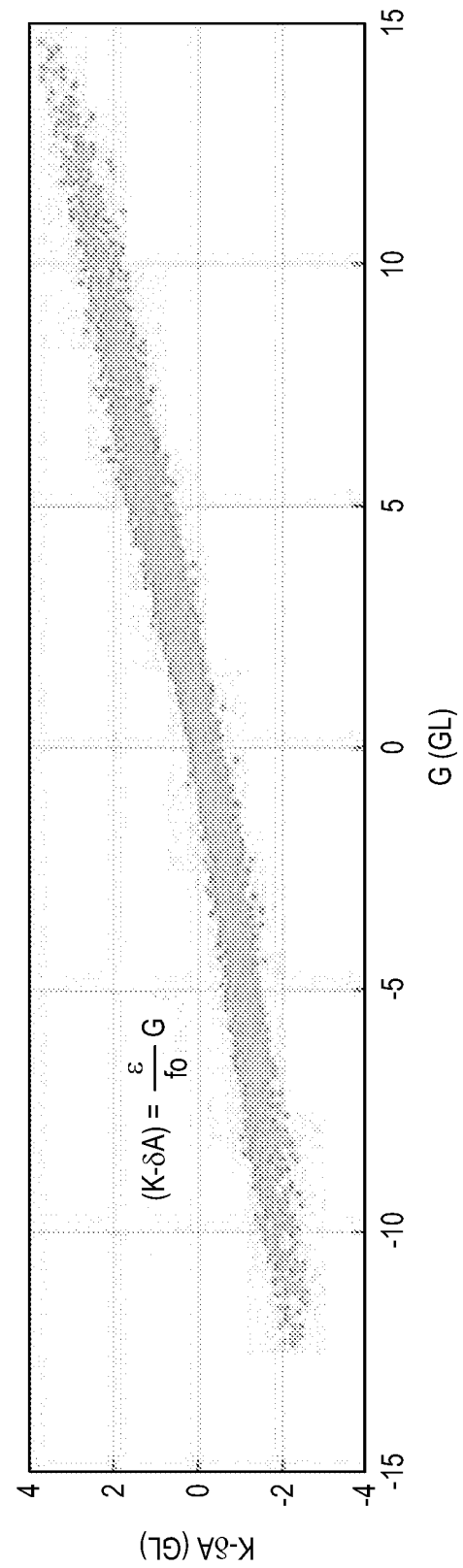

FIGS. 5A and 5B show measurement results demonstrating modelling according to some embodiments of the invention. In FIG. 5A, per pixel data shows the linear relation between G and K. Solid points are the original data set (each point is a different wavelength) and the hollow black points are the shifted K. The upper graph of FIG. 5B shows K as a function of G for multiple pixels and wavelengths (each wavelength is a different shade). The lower graph of FIG. 5B bottom shows the same data after shifting the K by δA. The total OVL is given by the weighted average of the per pixel OVL (or simply the slope per pixel).

In order to see if the self-accuracy metrology gives good results several flags were created. The first flag checked the amount of grey-levels that the signal has by looking at the standard error of G values in the wavelength direction. The standard deviation, σ, is calculated for every pixel and is related to the Wpp in the following way:

$$\sigma_\lambda = \sqrt{W_{pp}(\text{pix})}. \quad \text{Equation 12:}$$

The first flag was defined as $SE_{\lambda,max}$. It was equal to the top $98^{th}$% value of $\sigma_\lambda$. The second flag was the $PCA_{ratio}$ which takes the ratio of the principal components values for the (G, Kshift) data set. The principal component value of the data set gives the effective width of the data in two major directions as seen in FIG. 6 described further herein.

An estimation of the error for the self-accuracy metrology is given by $$PCA_{ratio} = f_0 \frac{PCA_{min}}{PCA_{max}}. \quad \text{Equation 13}$$

Figure 6:
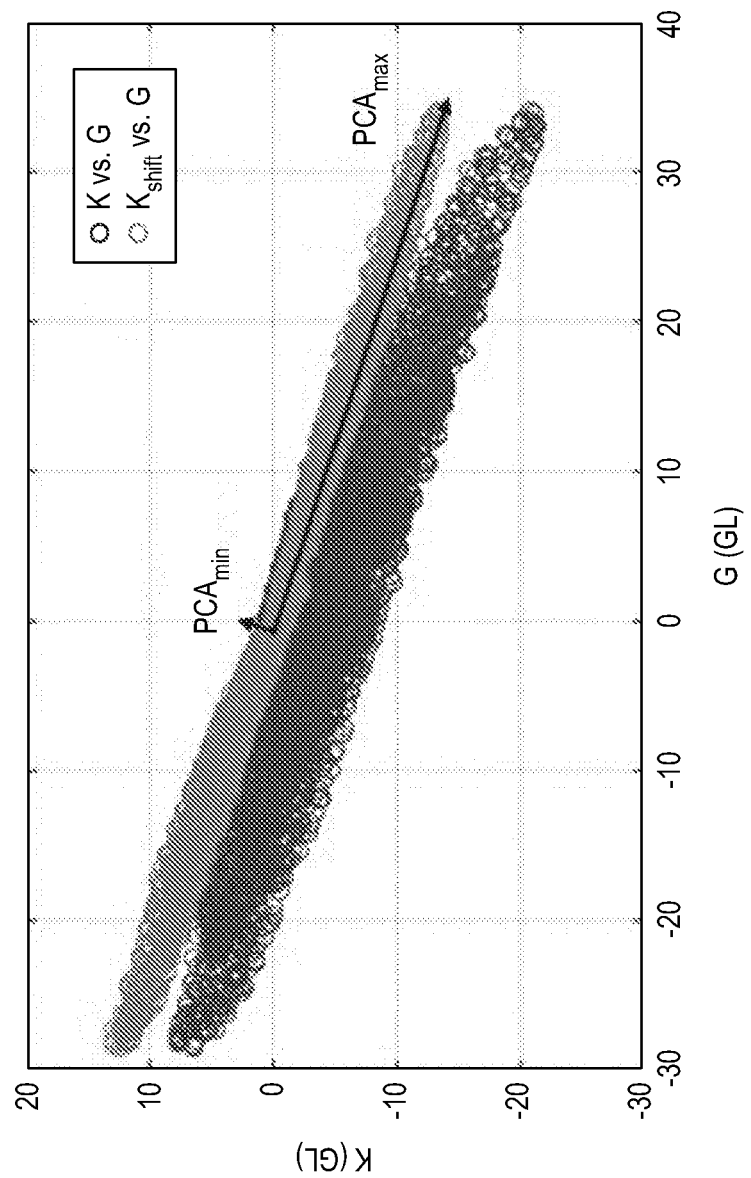
FIG. 6 is a graph illustrating the accuracy of OVL measurements obtained by methods according to some embodiments of the invention.

FIG. 6 shows an example for calculating $PCA_{ratio}$ by finding the "width" of the shifted K versus G data set (shown in different shades of grey) in both principal directions. The original data set is seen in blue demonstrating the decrease in $PCA_{min}$ due to shifting the K values by δA.

Using self-accuracy on different targets enables the measurement of true, or absolute OVL (as opposed to relative OVL which is measured in some techniques) at various locations in the field. Doing so allows the probing of pattern placement error (PPE) influence on OVL as was discussed in US20160253450A1.

Furthermore, once the inaccuracy free OVL is calculated, it can be used in several manners. If self-accuracy measurements are performed over a large set of sites all over the wafer, they can be presented as the final OVL results. On the other hand, a set of OVL measurements can also be used as an after development inspection (ADI) self-reference OVL value for other OVL measurements (such as standard SCOL measurements). Finally, this set of OVL values could be plugged in as a reference value for learning algorithms, used to compare ADI to after etch inspection (AEI) and so on.

Aspects of some embodiments of the invention include one or more of: the use of continuous and tunable wavelength optical measurements simultaneously to calculate OVL, fitting the data per pixel in order to root out the inaccuracy forming signal from each pixel, and finding self-reference OVL values by multiple corrected optical signals with a weighted average according to the pixels "strength".

Aspects of the present invention are described above with reference to flowchart illustrations and/or portion diagrams of methods, apparatus (systems) and computer program products according to embodiments of the invention. It will be understood that each portion of the flowchart illustrations and/or portion diagrams, and combinations of portions in the flowchart illustrations and/or portion diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or portion diagram or portions thereof.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or portion diagram or portions thereof.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or portion diagram or portions thereof.

The aforementioned flowchart and diagrams illustrate the architecture, functionality, and operation of possible implementations of systems, methods and computer program products according to various embodiments of the present invention. In this regard, each portion in the flowchart or portion diagrams may represent a module, segment, or portion of code, which comprises one or more executable instructions for implementing the specified logical function(s). It should also be noted that, in some alternative implementations, the functions noted in the portion may occur out of the order noted in the figures. For example, two portions shown in succession may, in fact, be executed substantially concurrently, or the portions may sometimes be executed in the reverse order, depending upon the functionality involved. It will also be noted that each portion of the portion diagrams and/or flowchart illustration, and combinations of portions in the portion diagrams and/or flowchart illustration, can be implemented by special purpose hardware-based systems that perform the specified functions or acts, or combinations of special purpose hardware and computer instructions.

In the above description, an embodiment is an example or implementation of the invention. The various appearances of "one embodiment", "an embodiment", "certain embodiments" or "some embodiments" do not necessarily all refer to the same embodiments. Although various features of the invention may be described in the context of a single embodiment, the features may also be provided separately or in any suitable combination. Conversely, although the invention may be described herein in the context of separate embodiments for clarity, the invention may also be implemented in a single embodiment. Certain embodiments of the invention may include features from different embodiments disclosed above, and certain embodiments may incorporate elements from other embodiments disclosed above. The disclosure of elements of the invention in the context of a specific embodiment is not to be taken as limiting their use in the specific embodiment alone. Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described. Meanings of technical and scientific terms used herein are to be commonly understood as by one of ordinary skill in the art to which the invention belongs, unless otherwise defined. While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

What is claimed is:

1. A method of determining overlay ("OVL") in a pattern in a semiconductor wafer manufacturing process comprising:
receiving images captured from a metrology target formed in at least two different layers in a wafer with parts of the metrology target offset in opposing directions with respect to corresponding parts in a different layer, using radiation of multiple different wavelengths, each of the images captured from the metrology target including +1 and −1 diffraction patterns;
determining a first and second differential signal for respective parts of the metrology target by subtracting opposing pixels from the +1 and −1 diffraction patterns in each of the images for each of the multiple different wavelengths;
determining an OVL for each of the opposing pixels based on first and second differential signals from the multiple different wavelengths; and
determining an overall OVL as a weighted average of the OVL of each of the opposing pixels, wherein the weighted average is weighted according to a variation of a sensitivity of the OVL due to variations in wavelength.

2. The method of claim 1 wherein determining the OVL for one of the opposing pixels comprises:
determining an asymmetry of the differential signals by using an average of the differential signals ($K_{sig}$) and a sensitivity of the differential signals to the OVL using a difference of the differential signals ($G_{sig}$);
determining a first matrix comprising values of sensitivity at different wavelengths;
determining a second matrix comprising values of average differential signals at the different wavelengths; and
determining the overall OVL by a formula that includes the first and second matrices.

3. The method of claim 2 wherein the first matrix is defined as:

$$G_{sig}(\lambda,\text{pix}) = \tfrac{1}{2}(D_1(\lambda,\text{pix}) - D_2(\lambda,\text{pix}))$$

where $D_1$ and $D_2$ represent the differential signals.

4. The method of claim 2 wherein the second matrix is defined as:

$$K_{sig}(\lambda,\text{pix}) \equiv \tfrac{1}{2}(D_1(\lambda,\text{pix}) + D_2(\lambda,\text{pix}))$$

where $D_1$ and $D_2$ represent the differential signals.

5. The method of claim 2 wherein;
determining the OVL for one of the opposing pixels comprises determining a resonant wavelength at which a sensitivity approximates zero; and
said different wavelengths comprise different wavelengths on either side of the resonant wavelength.

6. The method of claim 2 wherein the different wavelengths are selected from flat regions, or a combination of flat and resonant regions, in a signal spectral landscape.

7. The method of claim 2 wherein the OVL for the opposing pixels is determined as $$OVL_{pp}(pix) = f_0 \frac{\langle K \cdot G \rangle - \langle K \rangle \cdot \langle G \rangle}{\langle G \cdot G \rangle - \langle G \rangle \cdot \langle G \rangle}$$

where G is the first matrix and K is the second matrix.

8. The method of claim 7 wherein the overall OVL is determined as $$\text{overlay} = \frac{\sum_{pix} OVL_{pp}(pix) \cdot W_{pp}(pix)}{\sum_{pix} W_{pp}(pix)}.$$

9. The method of claim 1 comprising determining a per pixel inaccuracy $\delta A(\text{pix})$ from the overall overlay, and detecting a variation in the semiconductor wafer manufacturing process by monitoring variations in said per pixel inaccuracy.

10. The method of claim 9 wherein the per pixel inaccuracy is determined as:

$$\delta A(pix) = \langle K \rangle - \frac{\text{overlay}}{f_0} \langle G \rangle,$$

where $f_0$ is the metrology target offset.

11. A computer readable medium comprising instructions which, when implemented in a processor in an analysis unit of a metrology system, cause the system to implement the method of claim 1.

* * * * *